United States Patent
Ashar et al.

[11] Patent Number: 6,035,109
[45] Date of Patent: *Mar. 7, 2000

[54] METHOD FOR USING COMPLETE-1-DISTINGUISHABILITY FOR FSM EQUIVALENCE CHECKING

[75] Inventors: Pranav N Ashar; Aarti Gupta; Sharad Malik, all of Princeton, N.J.

[73] Assignee: NEC USA, Inc., Princeton, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/847,952

[22] Filed: Apr. 22, 1997

[51] Int. Cl.[7] .................................................. G06F 15/60
[52] U.S. Cl. ........................................................ 395/500.04
[58] Field of Search ..................... 364/488, 489, 364/490, 491

[56] References Cited

U.S. PATENT DOCUMENTS

| | | | |
|---|---|---|---|
| 5,331,568 | 7/1994 | Pixley | 364/489 |
| 5,491,639 | 2/1996 | Filkorn | 364/488 |
| 5,513,122 | 4/1996 | Cheng | 364/489 |
| 5,740,070 | 4/1998 | Nishimoto | 364/488 |

*Primary Examiner*—Kevin J. Teska
*Assistant Examiner*—Thuan Do
*Attorney, Agent, or Firm*—Sughrue, Mion, Zinn, Macpeak & Seas, PLLC

[57] ABSTRACT

The Complete-1-Distinguishability (C-1-D) property is used for simplifying FSM verification. This property eliminates the need for a traversal of the product machine for the implementation machine and the specification machine. Instead, a much simpler check suffices. This check consists of first obtaining a 1-equivalence mapping between the states of the two machines, and then checking that it is a bisimulation relation. The C-1-D property can be used directly on specifications for which it naturally holds. This property can be enforced on arbitrary FSMs by exposing some of the latch outputs as pseudo-primary outputs during synthesis and verification. In this sense, the synthesis/verification methodology provides another point in the tradeoff curve between constraints-on-synthesis versus complexity-of-verification.

10 Claims, 3 Drawing Sheets

METHOD FOR USING COMPLETE-1-DISTINGUISHABILITY FOR FSM EQUIVALENCE CHECKING

BACKGROUND OF THE INVENTION

1. Field of the Invention

The present invention relates generally to a method for using Complete-1-Distinguishability for FSM equivalence checking. More particularly, the subject invention pertains to a methodology that simplifies the problem of FSM verification, and considers the case where the specification FSM has a Complete-1-Distinguishability (C-1-D) property, i.e. all state pairs are 1-distinguishable. The main idea is that if each state of the specification FSM can be distinguished from all others by an input sequence of length 1, then the only equivalence class of the implementation FSM which is possibly equivalent to it, can be easily found by using a mapping induced by 1-equivalence between the states of the two FSMs.

2. Discussion of the Prior Art

Checking the equivalence of finite state machines (FSMs) is an important problem in formal verification of hardware designs. The basic algorithm for checking the equivalence of two FSMs consists of first building a product state machine by a parallel composition of the individual machines. This product state machine has lockstep transitions on the common inputs, and it is checked that the outputs of the two machines are identical in every state pair which is reachable from the initial state pair. The reachability of the product state pair is an essential requirement in this check. Therefore, in the general case, a traversal needs to be performed on the product state space. Typically, this traversal is done symbolically by using Binary Decision Diagrams (BDDs) to represent the state transition functions (or relations) and the sets of reachable states. Research in this direction has led to numerous techniques that focus on forward traversal, backward traversal, as well as approximate traversal. As with most BDD-based techniques, their practical limitations stem from extensive memory requirements, especially when handling large machines.

Though the general FSM equivalence problem requires state space traversal of the product machine, simplifications are possible by placing restrictions on the synthesis process. In particular, if the latch boundaries in the pre-synthesis specification are fixed and maintained throughout synthesis, then the resulting implementation has the same state encoding with a known correspondence of latches. In this case, it suffices to perform a combinational equivalence check on the output and next-state functions of the two machines. (The combinational checks can be restricted to reachable states in order to give an exact result.) Numerous researchers, as well as some commercial tools, have used this combinational methodology to check sequential circuits in practice.

SUMMARY OF THE INVENTION

Accordingly, it is a primary object of the invention to provide a method for using Complete-1-Distinguishability for FSM equivalence checking.

A further object of the subject invention is the provision of a methodology that simplifies the problem of FSM verification, and considers the case where the specification FSM has a Complete-1-Distinguishability (C-1-D) property, i.e. all state pairs are 1-distinguishable. The main idea is that if each state of the specification FSM can be distinguished from all others by an input sequence of length 1, then the only equivalence class of the implementation FSM which is possibly equivalent to it, can be easily found by using a mapping induced by 1-equivalence between the states of the two FSMs.

The present invention recognizes that when the specification machine has the C-1-D property, the 1-equivalence mapping is a bisimulation relation if and only if the two machines are equivalent. Since 1-equivalence is much easier to compute than general equivalence, the verification problem is potentially simplified. In particular, the product machine traversal on all sequences of input transitions is replaced by checking all single input transitions between state pairs in the mapping.

The C-1-D property may hold naturally for some specifications, such as some arithmetic datapaths, and can be exploited directly in these cases. For cases where this property does not hold, a method is provided to enforce it on arbitrary circuits, by exposing some latches as pseudo-primary outputs. Naturally this places some constraints on the possible sequential optimizations during synthesis. However, these constraints are milder than those imposed by a combinational methodology, where all latch positions are fixed in addition to all latches being exposed. In this sense, the methodology can also be viewed as offering another point in the tradeoff curve between constraints-on-synthesis versus complexity-of-verification. It lies somewhere in between the two extremes of combinational methodology with no sequential optimization in synthesis, and full product machine traversal with complete sequential optimization in synthesis. Furthermore it fits in naturally within the existing design flow.

In accordance with the teachings herein, the present invention provides a method for using Complete-1-Distinguishability for equivalence checking of a specification finite state machine M1 and an implementation finite state machine M2. First consider a specification finite state machine M1 having a Complete-1-Distinguishability property wherein all state pairs are 1-distinguishable such that each state of the specification finite state machine M1 can be distinguished from all other states by an input sequence of length 1. Then obtain a 1-equivalence mapping between states of the specification finite state machine M1 and the implementation finite state machine M2. Finally, check that the 1-equivalence mapping is a bisimulation relation, which indicates that the specification finite state machine M1 and implementation finite state machine M2 are equivalent.

In greater detail, the 1-equivalence mapping defines a relation $\chi$ between the reachable states of machines M1 and M2, as follows, $$\chi \subseteq P \times Q = \{(p, q) \mid p \text{ is reachable in } M1,$$

$$q \text{ is reachable in } M2,$$

$$p \text{ and } q \text{ are 1-equivalent}\}$$

wherein $\subseteq$ means is a subset of,

P,Q are the sets of states of machines M1, M2, p,q are states of machines M1, M2, × means a cross product of, { } means a set,

| means such that, such that $\chi$ captures those pairs of reachable states between the two machines that are 1-equivalent, which means they produce the same output for each input.

In further detail, perform traversal on finite state machine M1 to obtain a set of all reachable states, and if traversal does not complete, assume all states in finite state machine M1 are reachable. Check if finite state machine M1 has the Complete-1-Distinguishability property on all reachable states. If finite state machine M1 does not have the Complete-1-Distinguishability property, then enforce the Complete-1-Distinguishability property on the finite state machine M1 by exposing a subset of latches as pseudo-primary outputs. This means they are used only in the process of synthesis and verification of finite state machine M1, and any logic/wiring associated exclusively with the pseudo-primary outputs is eliminated in the final implementation of finite state machine M1. Perform sequential synthesis to obtain finite state machine M2. Perform traversal on finite state machine M2 to obtain a set of all reachable states, and if traversal does not complete, assume all states in finite state machine M2 are reachable. Obtain X, and ensure X is a one-to-many mapping. Finally, perform the Complete-1-Distinguishability equivalence check, and if positive, finite state machine M1 is equivalent to finite state machine M2, and if not positive, then finite state machine M1 is not equivalent to finite state machine M2.

In greater detail, the Complete-1-Distinguishability equivalence check verifies that X is a bisimulation relation as follows:

Check that for all (p, q) $\in$ X:

$$\forall_{i \in I}(p,i,s) \in \Delta_1 \Rightarrow \exists_{t \in Q}((q,i,t) \in \Delta_2 \wedge (s,t) \in \chi) \quad (1)$$

$$\forall_{i \in I}(q,i,t) \in \Delta_2 \Rightarrow \exists_{s \in P}((p,i,s) \in \Delta_1 \wedge (s,t) \in \chi) \quad (2)$$

wherein $\forall$ means for all,
i is an input,
$\in$ means is an element of,
I is a set of inputs,
p and s are states of machine M1 having a transition i therebetween,
q and t are states of machine M2 having a transition i therebetween,
$\Delta_1$, $\Delta_2$ are the transition relations of the machines M1, M2, respectively,
$\Rightarrow$ means then,
$\exists$ means there exists,
P,Q are sets of states of machines M1, M2,
$\wedge$ means and,
such that check (1) states that for all inputs i, which are an element of I, such that there is an i transition from state p to state s, which belong to transition relation $\Delta_1$, then there exists a state t, which belongs to the set of states Q, such that there is an i transition from state q to state t, which belongs to transition relation $\Delta_2$, and wherein states s and t belong to $\chi$. And check (2) states that for all inputs i, which are an element of I, such that there is an i transition from state q to state t, which belong to transition relation $\Delta_2$, then there exists a state s, which belongs to the set of states P, such that there is an i transition from state p to state s, which belongs to a transition relation $\Delta_1$, and wherein states s and t belong to $\chi$. Checks 1 and 2 are performed for every state pair where the states are 1-equivalent and are individually reachable.

If the Complete-1-Distinguishability property is not true for a finite state machine M1, then the Complete-1-Distinguishability property is enforced on the finite state machine M1 by exposing a subset of the latches as pseudo-primary outputs. This means they are used only in the process of synthesis and verification of finite state machine M1, and any logic/wiring associated exclusively with the pseudo-primary outputs is eliminated in the final implementation of finite state machine M1. The subset of latches is selected by first obtaining a set of all distinct state pairs which need to be distinguished, which means they have identical outputs on all inputs. Next identify those latches which exhibit a different value in some of the pairs, and then select a subset of latches which covers all pairs.

BRIEF DESCRIPTION OF THE DRAWINGS

The foregoing objects and advantages of the present invention for a method for using Complete-1-Distinguishability for FSM equivalence checking may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

1 The equations herein use standard symbols as are used in this art, wherein:

| | |
|---|---|
| $\subseteq$ | means is a subset of; |
| $\in$ | means is an element of or belongs to; |
| $\rightarrow$ | means is a function; |
| $\forall$ | means for all; |
| $\Rightarrow$ | means then; |
| $\Leftrightarrow$ | means if and only if; |
| $\exists$ | means there exists; |
| {} | means a set; |
| \| | means such that; |
| $\wedge$ | means and; |
| v | means or; |
| : | means is; |
| X | means a cross product of. |

2 C-1-D- and FSM Equivalence

Let M1=(P,I,Z,$\Delta_i$,$\lambda_1$,p$_0$) be the specification machine, and M2=(Q,I,Z,$\Delta_2$,$\lambda_2$,q$_0$) be the implementation machine, where:

I and Z are the common inputs and outputs
P,Q are the sets of states
$\Delta_1$, $\Delta_2$ are the transition relations
$\Delta_1 \subseteq$ P×I×P, $\Delta_2 \subseteq$ Q×I×Q
$\lambda_1$, $\lambda_2$ are the output functions
Mealy model: $\lambda_1$: P×I→Z, $\lambda_2$: Q×I→Z
Moore model: $\lambda_1$: P→Z, $\lambda_2$: Q→Z
p$_0$,q$_0$ are the initial states, respectively.

Transition relations have been used in order to handle incompletely-specified deterministic machines, i.e. the transition from state p$\in$P on some input i$\in$I may be missing. (Similarly for Q.) In order to use output functions (instead of output relations), we arbitrarily set $\lambda$(p, i)=$\phi$ for a missing transition (p,i), where φ is a special output symbol not in Z. (At present, we do not handle more general forms of nondeterminism.) The methodology described hereinbelow is for the more general Mealy machine model.

2.1 The C-1-D Property

Definition 1: A Moore machine M1 is said to have the C-1-D property if all pairs of distinct states have different outputs, i.e. $\forall_{p_1 \in P} \forall_{p_2 \in P}(p_1 \neq p_2) \rightarrow \lambda_1(p_1) \neq \lambda_1(p_2)$ Definition 2: A Mealy machine M1 is said to have the C-1-D property if for all pairs for distinct states, there exists some input which produces different outputs, i.e. $\forall_{p_1 \in P} \forall_{p_2 \in P}(p_1 \neq p_2) \Rightarrow \exists_{i \in I} \lambda_1(p_1, i) \neq \lambda_2(p_2, i)$ 2.2 The 1-Equivalence Mapping Define a relation χ, between the reachable states of machines M1 and M2, as follows:

Definition 3:

$$\chi \subseteq P \times Q = \{(p, q) \mid p \text{ is reachable in } M1,$$
$$q \text{ is reachable in } M2,$$
$$p \text{ and } q \text{ are 1-equivalent}\}$$

i.e. $(p, q) \in \chi \Leftrightarrow ((p \in P^*) \wedge (q \in Q^*) \wedge$
$(\forall_{i \in I} \lambda_1(p, i) = \lambda_2(q, i)))$ In the above definition, P* and Q* denote the set of reachable states in M1 and M2, respectively. Note that checking 1-equivalence of p and q does not require a traversal of the product machine. However, obtaining P* and Q* does require traversal of the individual machines. If the reachability requirement is relaxed (e.g. in cases where even individual machine traversal cannot be completed), the technique provides a conservative equivalence check by assuming that all states in M1 and M2 are individually reachable (as discussed later in this section).

Thus, χ captures those pairs of reachable states between the two machines that are 1-equivalent, i.e. they produce the same output for each input. For general machines, χ can be a many-to-many mapping. However, if M1 satisfies the C-1-D property and M2 does not, then χ is a one-to-many mapping. This allows for the possibility where each state of M1 is implemented by an equivalence class of states in M2. We also check to ensure that χ includes all reachable states in M1.

2.3 The C-1-D Equivalence Check

Figure 1:
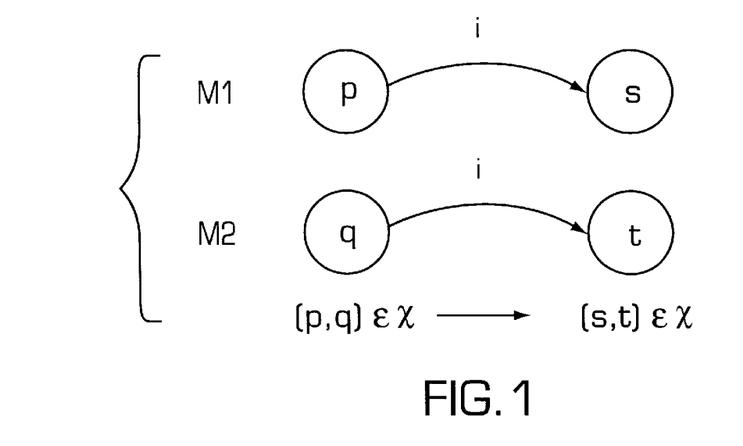
FIG. 1 illustrates graphically the C-1-D equivalence check for two finite state machines M1 and M2.

Definition 4: The C-1-D Equivalence Check verifies that χ is a bisimulation relation as follows:

Check that for all $(p, q) \in \chi$:

(1): $\forall_{i \in I} (p, i, s) \in \Delta_1 \Rightarrow \exists_{t \in Q} ((q, i, t) \in \Delta_2 \wedge (s, t) \in \chi)$ (2): $\forall_{i \in I} (q, i, t) \in \Delta_2 \Rightarrow \exists_{s \in Q} ((p, i, s) \in \Delta_1 \wedge (s, t) \in \chi)$ Note that Checks 1 and 2 are performed for every state pair when the states are 1-equivalent and are individually reachable. As shown in FIG. 1, this checks the existence of corresponding transitions (i.e. transitions on the same input), and also that these transitions preserve χ. Checking the existence is needed to ensure that no transition present in one machine is missing in the other, which forms the basis of equivalence generally supported for incompletely-specified machines. (Other notions can also be easily formulated.)

In general, verification of two given machines by a traversal of their product machine can also be viewed as checking that the relation R, consisting of pairs of states that are simultaneously reachable and 1-equivalent, is a bisimulation relation. Here, a traversal of the product machine is performed in order to know precisely which state pairs are simultaneously reachable. In face, if there were a way to capture this set apriori, there would be no need to perform a traversal of the product machine.

This also provides the motivation for this work, which is based on exploiting conditions under which a simpler relation serves as a bisimulation relation. In particular, we prove that if all state pairs in the specification machine are 1-distinguishable (i.e. M1 has the C-1-D property), then we need to check that the 1-equivalence mapping between the reachable states of the two machines (i.e. χ) is a bisimulation relation. (This argument can be generalized further to show that if all state pairs in a specification are k-distinguishable (k≧1), then we need to check that the k-equivalence mapping between the two machines is a bisimulation relation. Naturally, obtaining the k-equivalence mapping itself becomes harder as k increases.)

TABLE 1

The C-1-D Synthesis/Verification Procedure

Task: Given the specification machine M1,
synthesize an implementation machine M2,
and check their equivalence
1. Perform traversal on M1 to obtain the set of all reachable states.
(If traversal does not complete, assume all states in M1 are reachable; the check in Step 7 will be conservative.)
2. Check if M1 has the C-1-D property on all reachable states.
3. If M1 does not have the C-1-D property, enforce it by using the procedure described in Section 4.
(This might introduce some pseudo-primary outputs.)
4. Perform sequential synthesis to obtain M2.
5. Perform traversal on M2 to obtain the set of all reachable states.
(If traversal does not complete, assume all states in M2 are reachable; the check in Step 7 will be conservative.)
6. Obtain χ as shown in Definition 3.
Check to make sure it is a one-to-many mapping.
7. Perform the C-1-D Equivalence Check.
If check is positive, M1 is equivalent to M2.
If check is negative, M1 is not equivalent to M2.

2.4 The C-1-D Synthesis/Verification Procedure

The complete procedure, which interleaves verification steps with synthesis, is summarized in Table 1. The procedure used to enforce the C-1-D property for arbitrary machines (Step 3) is described in detail in Section 4.

We now show that when M1 has the C-1-D property, the C-1-D Equivalence Check is both necessary and sufficient for the equivalence of M1 and M2.

Lemma 1 (sufficient case): The C-1-D Equivalence Check is positive only if M1 is equivalent to M2.

Figure 2:
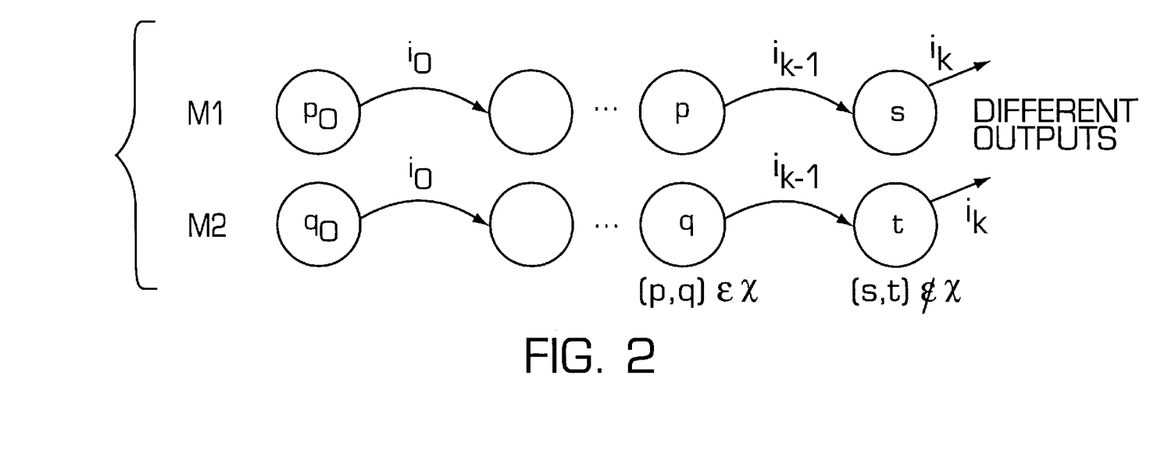
FIG. 2 illustrates a distinguishing input sequence for two finite state machines M1 and M2.

Proof: This is a standard argument which does not even depend on M1 having the C-1-D property. The proof is by contradiction. Suppose M1 is not equivalent to M2. Then there exists a shortest distinguishing input sequence for the two machines. Let $\rho = i_0 i_1 \ldots i_{k-1} i_k$ be such a sequence, as shown in FIG. 2, where s and t are the states reached in M1 and M2, respectively, before $i_k$ is applied to produce the distinguishing output. Clearly, $(s,t) \notin \chi$. Since ρ is the shortest distinguishing input sequence, the predecessor states of s and t are 1-equivalent, i.e. $(p,q) \in \chi$. Therefore, the C-1-D equivalence check will be negative when it checks $(p,q) \in \chi$.

Lemma 2 (necessary case): When M1 has the C-1-D property, the C-1-D Equivalence Check is positive if M1 is equivalent to M2.

Proof: Again, the proof is by contradiction. Suppose that the C-1-D Equivalence check is negative for some state pair (p,q), as shown again in FIG. 2. Thus, either the transition on some input $i_{k-1}$ is missing in exactly one of the two machines, or it does not preserve $\chi$ in the next state pair (s,t). We use this to produce a distinguishing input sequence, thereby proving that M1 is not equivalent to M2.

First, note that both p and q are individually reachable in M1 and M2, respectively (Definition 3 for $\chi$). Furthermore, whenever q is reached in M2, either:

(1) state p is reached in M1, or (2) some state other than p, say p', is reached in M1.

In case(1), a distinguishing sequence starts off by first visiting (p,q) and then applying $i_{k-1}$. If the transition on $i_{k-1}$ is missing in exactly one machine, the outputs will mismatch at this point itself (recall that outputs on missing transitions are arbitrarily set to $\phi$). If both transitions exist, apply $i_k$ (which distinguishes between successors s and t) to obtain the distinguishing sequence.

For case(2), note that p' and p are 1-distinguishable due to the C-1-D property of M1. Since p and q are 1-equivalent, by transitivity p' and q are 1-distinguishable. Again, we get a distinguishing sequence by first visiting (p',q). If the transition is missing, we get a mismatch. Otherwise, we get a distinguishing sequence by applying the input which distinguishes between p' and q.

Thus, in both cases, M1 is not equivalent to M2.

Theorem: When M1 has the C-1-D property, the C-1-D Equivalence Check is positive if and only if M1 is equivalent to M2.

Proof: By Lemmas 1 and 2.

Figure 3:
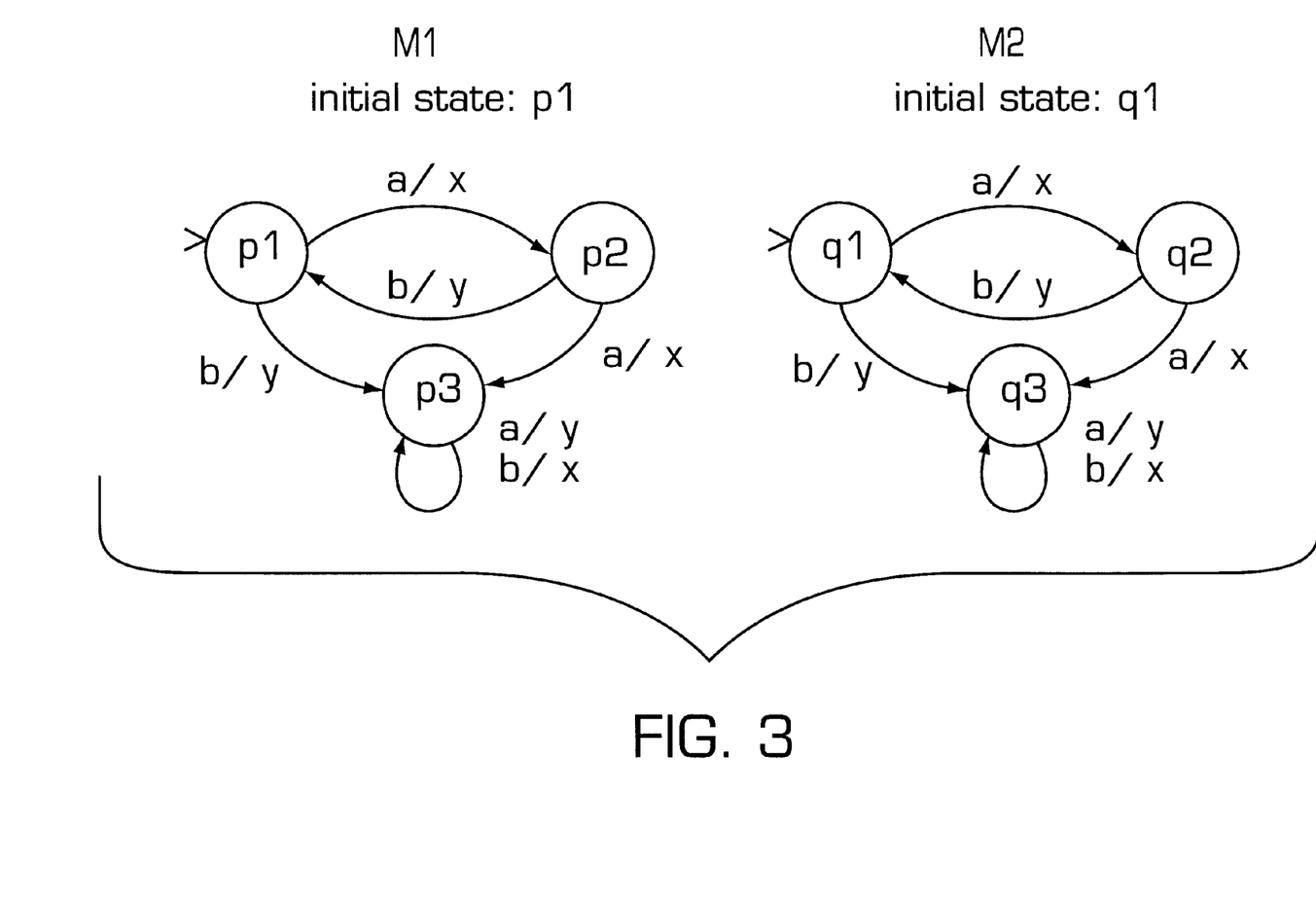
FIG. 3 illustrates two finite state machines M1 and M2 wherein machine M1 does not have the C-1-D property, which results in a false negative check of the equivalence of the machines.

Note, that we relied on the C-1-D property of M1 only to prove the necessary case. It is interesting to further examine this point, especially with reference to an arbitrary M1, where M1 does not have the C-1-D property. If the machines are not equivalent, $\chi$ represents a set which is sufficient to uncover the mismatch (as shown in Lemma 1). If the machines are equivalent, $\chi$ represents an over-estimate of the simultaneously reachable state pairs. Thus, a positive check implies the 1-equivalence of all simultaneously reachable state pairs, as is done in product traversal methods. However, if the check is negative, it could be a false negative. In particular, the check might fail for a pair (p,q) which is not simultaneously reachable. For example, consider the check for two identical machines shown in FIG. 3, where M1 does not have the C-1-D property. Here, $\chi=\{(p1, q1),(p1,q2),(p2,q1),(p2,q2),(p3,q3)\}$. Note that the C-1-D Equivalence Check will pass on pairs (p1,q1),(p2,q2), and (p3,q3), but will fail on the pairs (p1,q2) and (p2,q1). This false negative occurs because the latter two pairs are not simultaneously reachable.

The main purpose of the C-1-D property is to disallow such false negatives. When M1 has the C-1-D property, $\chi$ is constrained whereby for each state q in M2, there exists exactly one state p in M1 such that $(p,q)\in\chi$. Furthermore, if q is reachable in M2, then so is (p,q) in the product machine. Thus, when M1 has the C-1-D property, $(p,q)\in\chi$ are exactly the simultaneously reachable pairs in equivalent machines. Note, again, that reachability in the individual machines is a key requirement in this argument. This also explains why the C-1-D Equivalence Check is conservative in cases where reachability analysis of the individual machines cannot be completed in Steps 1 and 5 of our verification procedure.

3. Implementation Details

As before, let $M1=(P, I, Z, \Delta_1, p_0)$ denote the specification machine, and $M2=(Q, I, Z, \Delta_2, \lambda_2, q_0)$ denote the implementation machine. We use the standard symbolic Boolean function representations for sets/functions/relations.

For ease of notation, P denotes a vector of binary variables, and p a particular valuation. Individual variables are accessed by indexing, e.g. the $j^{th}$ state variable of M1 is denoted P[j], and its value in a particular valuation p is denoted p[j]. We also use P1, P2 etc. to refer to different copies of the variable vector P. In many equations, =($\neq$) are used synonymously for the Boolean operations $\oplus(\overline{\oplus})$.

With reference to Table 1, the various steps of the verification procedure are implemented as follows:

Step 1: Standard traversal techniques are used to obtain P*, the set of all reachable states in M1. If this traversal cannot be completed, set P*=1, and note that the check in Step 7 will be conservative.

Step 2: Checking the C-1-D Property for M1 (corresponds to Definition 2)

$$\exists_I \left( \bigvee_{j=1}^{j=w} (\lambda_1[j](P_1, I) \neq \lambda_1[j](P_2, I)) \right) \bigwedge P_1^* \bigwedge P_2^* =$$

$$\left( \bigvee_{k=1}^{k=n} (P_1[k] \neq P_2[k]) \right) \bigwedge P_1^* \bigwedge P_2^*$$

The left band side of the above equation computes the set of pairs of all reachable states which have a different output on at least one input(where the number of outputs is $\omega$). The right hand side of the equation computes state pairs where each state is reachable and distinct from the other (where n is the number of state variables in M1). If the equation is true, then M1 has the C-1-D property, otherwise it does not. (In the equation, $P_1^*(P_2^*)$ denotes the set of reachable states of M1, expressed in terms of vector $P_1(P_2)$ replacing P).

Steps 3 and 4: Described in Sections 4 and 5.

Step 5: Again, standard traversal techniques are used to obtain Q*, the set of all reachable states in M2. If traversal cannot be completed, set Q*=1, and note that the check in Step 7 will be conservative.

Step 6: Obtaining the 1-Equivalence Mapping $\chi$ (corresponds to Definition 3)

$$\chi(P, Q) = \forall_I \left( \bigwedge_{j=1}^{j=w} (\lambda_1[j](P, I) = \lambda_2[j](Q, I)) \right) \bigwedge P^* \bigwedge Q^*$$

The quantification over I in and the xnor between the $\lambda_1$ and $\lambda_2$ are implemented using a single-pass xnor-forall operation over the BDDs, much like the and-smooth used in typical BDD packages.

Step 7: Performing the C-1-D Equivalence Check (Corresponds to Definition 4)

Define two new functions $\Delta'_1$, $\Delta'_2$ as follows:

$$\Delta'_1(Q, I, S) = \exists_P \Delta_1(P, I, S) \wedge \chi(P, Q) \quad (1)$$

$$\Delta'_2(Q, I, S) = \exists_T \Delta_2(Q, I, T) \wedge Q^* \wedge \chi(S, T) \quad (2)$$

Again, the and-smooth operation is used for both equations. If $\Delta'_1=\Delta'_2$, then the C-1-D Equivalence Check is positive, otherwise it is negative.

Figure 4:
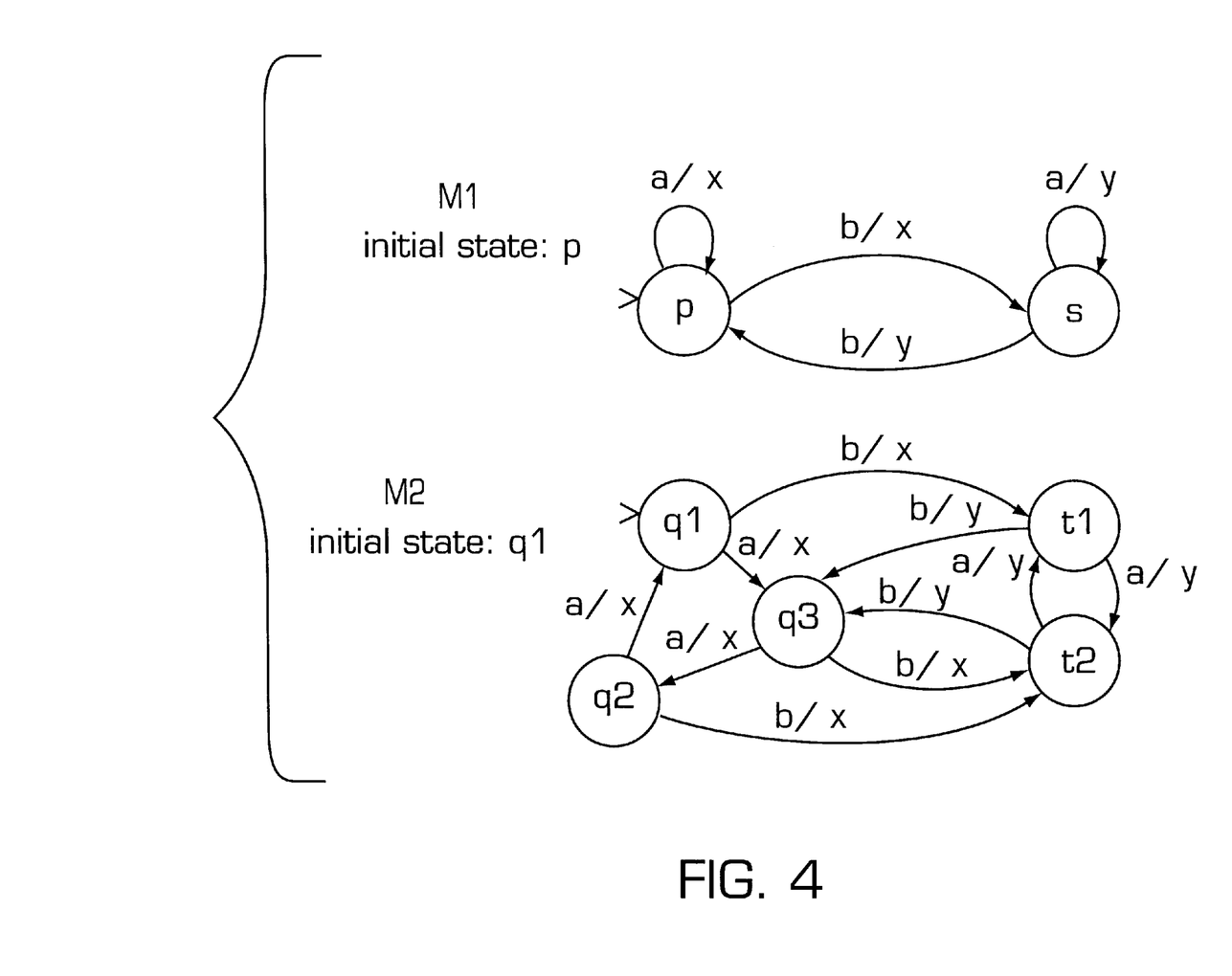
FIG. 4 illustrates an example of the C-1-D equivalence check for two finite state machine M1 and M2 which are equivalent.

Note, that $\Delta'_1$ relabels the source nodes of transitions in M1 according to $\chi$, while $\Delta'_2$ relabels the sink nodes of transitions in M2 according to $\chi$. Checking the equivalence of $\Delta'_1$ and $\Delta'_2$ implements the C-1-D Equivalence Check as follows. Consider first a transition from p in M1, as required in Check (1) of Definition 4. Suppose the corresponding transition from q is missing in M2. This will be flagged as a mismatch, because $\Delta'_1$ will contain a copy of M1's transition with source relabeled q, whereas $\Delta'_2$ will not contain any. Next, suppose the corresponding transition does exist, but $\chi$ is not preserved in the next state pair. In this case, the sink labels for these transitions will not match in $\Delta'_1$ and $\Delta'_2$. A similar argument holds for Check (2). An example is shown in FIG. 4 for two equivalent machines, where $\chi=\{(p,q1),(p,q2),(p,q3),(s,t1),(s,t2)\}$. Clearly, $\Delta'_1=\{(q1,a,p),(q2,a,p),(q3,a,p),(q1,b,s),(q2,b,s),(q3,b,s),(t1,a,s),(t2,a,s),(t1,b,p),(t2,b,p)\}=\Delta'_2$.

The efficiency of this check can be improved further in cases where the machines are completely specified, e.g. hardware circuits. The motivation is to replace the check on transition relations by checks on a vector of transition functions, since the latter are easier to build for large machines. Thus, Step 7 can also be implemented as follows:

foreach $j$ in $[1 \ldots n]$ $\{S'_1[j](Q, I) = \exists_P \delta_1[j](P, I) \bigwedge \chi(P, Q)$ $S'_2[j](Q, I) = ((\exists_{S[k \neq j]} \chi(S, T))|_{\forall j'\in[1\ldots m]T[j']=\delta_2[j'](Q,I)\wedge Q^*})|_{S[j]}$ Check whether $S'_1[j](Q, I) = S'_2[j](Q, I)$ Here the vector of next-states are computed by using the vector of transition functions $\delta_1[1 \ldots n]$ and $\delta_2[1 \ldots m]$. The equation for $S'_2$ is made somewhat complicated by the fact that the mapping from t to s (inverse of $\chi$) is many-to-one. The C-1-D Equivalence Check is positive if all checks in the above procedure are positive.

Complexity: As a rough measure of complexity, it is useful to consider both the number of Boolean variables used and the frequency of each operation. Let the number of state variables for M1 and M2 be n and m, respectively, the number of inputs be k, and the number of outputs be w. Then, the individual machine traversals require (2n+k) and (2m+k) variables for each iterative step in M1 and M2, respectively. Checking the C-1-D property requires (2n+k) variables and is performed once. Obtaining $\chi$ is done with (n+m+k) variables. Finally, the C-1-D Equivalence Check requires (n+2m+k) variables for checking transition relations, or (n+m+k) variables (n times) for checking transition functions (m≧n). The largest dependency here is on (2m+k) variables. In comparison, a product machine traversal requires (2n+2m+k)variables for each iterative step in the worst case. Thus, the number of variables required by product machine traversal will grow faster than that for the proposed method as the circuits increase in size. Furthermore, most techniques utilized in practice to alleviate the complexity of product machine traversal, such as the use of partitioned transition relations, will likely apply equally well in the methodology.

4 Ensuring the C-1-D Property

The verification method requires the C-1-D property in the specification machine M1. Since it is a strong requirement, it is reasonable to expect that many designs in practice may not exhibit it. Note that a straightforward way to ensure it is by exposing all latches in M1 as primary outputs. However, complete observability may be overly restrictive for synthesis. Therefore, the technique for ensuring the C-1-D property advocates partial observability, where we choose a subset of latches which are exposed as pseudo-primary outputs. We call them pseudo-primary outputs because they are used only in the process of synthesis and verification. In fact, any logic/wiring associated exclusively with them is eliminated in the final implementation.

The rationale of our technique for exposing a subset of latches in M1 is as follows. We first obtain the set D of all distinct state pairs which need to be distinguished, i.e. they have identical outputs on all inputs. Next, we identify those latches which exhibit a different value in some of these pairs. The task is then cast as a covering problem, where a subset of latches which covers all pairs is chosen. For example, let D=$\{(1011,0011),(1101,0111),(1100,0110)\}$, where the state labels refer to values on latches (starting with latch 1). Here, latches 1 and 3 have different values in at least one pair. However, latch 1 can cover all pairs, and is therefore chosen to be exposed. Note that there is no need to expose all 4 latches in order to guarantee C-1-D.

TABLE 2

Ensuring the C-1-D Property

Task: Given machine M1,
  find the minimal set of latches to expose,
  in order to ensure the C-1-D property.
(a) $D(P_1, P_2) =$
  $\forall_I(\wedge_{j=1}^{j=\omega} (\lambda_1[j](P_1, I) = \lambda_1[j](P_2, I))) \wedge P_1^* \wedge P_2^*$
(b) D' := D;
  foreach j in [1..n] {
    D' = $\exists_{P1[j]}\exists_{P2[j]}$D' $\wedge$ (L[j]$\overline{\oplus}$($P_1[j] \oplus P_2[j]$))
  }
(c) C(L) = D'(L) $\wedge$ ($\vee_{j=1}^{j=n}$ L[j])
(d) Solve the covering problem
  foreach j in [1..n] {
    C = V[j] $\wedge$ $C_{\overline{L[j]}}$ $\vee$ $\overline{V[j]}$ $\wedge$ $\exists_{L[j]}$C
  }
  Find a minimum assignment of V[j] = 1 s.t. C(V) = 0
(e) Expose latches corresponding to V[j] = 1 in the cover.

Implementation Details: The pseudo-code shown in Table 2 sets up the covering problem and solves it to obtain a minimal number of latches to be exposed as pseudo-primary outputs. Some of the optimizations we used include:

Step(a): using a one-pass xnor-forall BDD operation.

Step(b): using a specialized BDD operation to introduce the L variables, where L[j]=1 denotes a difference in the $j^{th}$ latch for some pair in D.

Step(d): implementing a greedy heuristic to iteratively select the latch which covers the maximum number of pairs until all pairs are covered, rather than finding all solutions using V variables as shown.

5 Impact on Synthesis

Enforcing the C-1-D property in M1 by exposing some of the latches as pseudo-primary outputs is potentially restrictive during the application of sequential optimization techniques. It is useful to examine this impact. State encoding is not affected since the latches are exposed only after the logic circuit has been derived. State minimization is also typically done before a logic circuit is obtained. Therefore, the subsequent exposing of latches has no impact on state minimization either. On the other hand, if the computationally complex step of state minimization or detection of equivalent states for use as don't-cares can be performed on the logic circuit, it is likely that verification using full product machine traversal can also be performed since they both depend on the ability to traverse the product state space. While combinational optimizations are not affected, the extraction of sequential output don't-cares corresponding to equivalent state don't-cares is affected by the insertion of the additional observability points. However, extraction of sequential input don't-cares corresponding to unreachable states is not affected. Finally, adding the pseudo-primary outputs does affect retiming by limiting the retimings that are possible in the circuit. The new output may block the backward movement of a latch across it, which would not have happened otherwise.

6. Practical Results and Discussion

The algorithms are implemented in the SIS framework using the CMU BDD package developed by David Long, [D. E. Long, BDD Package, Unpublished, 1993, School of Computer Science, Carnegie Mellon University, Pittsburgh, Pa.]. An important aspect of the algorithm is that it attempts to keep the number of variables in active use at any stage of the verification as small as possible. Even so, because of the large number of variable substitutions (swapping of one set of variables by another set) involved in the approach, the dynamic variable ordering facility in the CMU BDD package is important to make the approach viable. The experiments were

TABLE 3

Results for Exact C-1-D Check

| Name | C #L | C' #E | C -> C' T (s) | C" #L | Product T (s) | C1D T (s) |
|---|---|---|---|---|---|---|
| s27 | 3 | 2 | 2.5 | 5 | 2.5 | 2.5 |
| s208 | 8 | 3 | 2.8 | 10 | 3.0 | 3.0 |
| s298 | 14 | 8 | 2.9 | 59 | 9.6 | 13.8 |
| s344 | 15 | 7 | 23.2 | 26 | 49.4 | 81.6 |
| s349 | 15 | 7 | 23.2 | 26 | 48.7 | 81.6 |
| s382 | 21 | 15 | 7.6 | 50 | 100.6 | 71.4 |
| s386 | 6 | 2 | 2.9 | 6 | 3.6 | 3.2 |
| s400 | 21 | 15 | 7.6 | 50 | 99.4 | 78.5 |
| s420 | 16 | 3 | 3.0 | 20 | 3.9 | 5.4 |
| s444 | 21 | 15 | 7.6 | 50 | 110.9 | 199.3 |
| s510 | 6 | 5 | 3.1 | 19 | 4.9 | 8.6 |
| s526 | 21 | 15 | 5.8 | 51 | 66.2 | 288.9 |
| s526n | 21 | 15 | 6.0 | 51 | 74.5 | 116.9 |
| s641 | 19 | 1 | 8.2 | 20 | 80.4 | 42.0 |
| s713 | 19 | 1 | 8.2 | 20 | 74.6 | 35.8 |
| s820 | 5 | 4 | 3.3 | 10 | 5.2 | 4.8 |
| s832 | 5 | 4 | 3.2 | 10 | 5.3 | 4.7 |
| s838 | 32 | 3 | 4.0 | 104 | 389.7 | 101.5 |
| s953 | 29 | 20 | 264.0 | 41 | — | 203.0 |
| s1196 | 18 | 6 | 13.4 | 36 | 19.6 | 312.1 |
| s1238 | 18 | 6 | 13.7 | 41 | 54.6 | 477.5 |
| s1423 | 74 | 74* | — | 75 | — | — |
| s1488 | 6 | 6 | 4.2 | 12 | 7.3 | 5.8 |
| s1494 | 6 | 6 | 4.1 | 12 | 7.1 | 5.8 |
| cbp.16.4 | 16 | 0 | 3.0 | 16 | 3.8 | 18.7 |
| cbp.32.4 | 32 | 0 | 11.6 | 32 | 62.1 | 401.9 |
| mclc | 11 | 5 | 3.4 | 32 | 8.3 | 9.4 |
| minmax2 | 6 | 2 | 2.6 | 14 | 3.0 | 3.0 |
| minmax5 | 15 | 2 | 6.0 | 35 | — | 81.6 |
| minmax10 | 30 | 30* | — | 50 | — | — |
| sbc | 28 | 28* | — | 50 | — | — |
| tlc | 10 | 5 | 2.8 | 25 | 4.8 | 6.5 |
| traffic | 13 | 0 | 2.9 | 26 | 3.7 | 5.5 | conducted on a 115 MHZ SPARC 5 with 256 MB of main memory. For each experiment a CPU time limit of 10,000 seconds was imposed. A "–" under the CPU Time columns in Tables 3 and 4 indicates a timeout with this limit.

6.1 Enforcing the C-1-D Property

Table 3 provides results for the first set of experiments. Given a sequential circuit C, it was first converted to an equivalent circuit C', by performing a reachability analysis and exposing the appropriate latches to enforce the C-1-D property. The BDD-based implicit covering method discussed in Section 4 was used. In the table, the number of latches in C is shown in Column 2(#L), the number of latches exposed in C' in column 3(#E), and the CPU time for checking/enforcing the C-1-D property in Column 4.

It can be seen that only a fraction of the latches need to be exposed in most of the circuits. Consider the example of s838. Only 3 out of its 32 latches need to be exposed in order to achieve the C-1-D property. The smaller the number of latches exposed, the smaller is the expected restrictive effect of imposing this property on synthesis algorithms. Note also that in some cases the C-1-D property is satisfied naturally, e.g. the cbp circuits. In these cases, it can be directly exploited to simplify the verification task without incurring any restrictive effects during synthesis. It is believed that this property will either hold or can be easily enforced for most datapaths circuits, since most of the data states in these circuits tends to be observable, while the control state tends to be either absent or small.

In order to further study the impact of enforcing C-1-D on sequential synthesis, a sequential optimization script was run in SIS on both C and C'. This script included sequential don't-care extraction and use, and retiming optimizations. For most of the examples, there was no difference in the area and delay reported by SIS. On the few examples with differences, there was <10% difference in delay, and <12% difference in area, with the differences being mostly in favor of C'. This indicates that these differences arose more due to the effects of technology mapping, than due to the constraints imposed by the methodology.

6.2 Exact C-1-D Equivalence Check

Having obtained C' which has the C-1-D property, it was then modified by retiming in order to obtain a structurally different but functionally equivalent circuit C". Note that retiming can potentially change the state-transition graph by splitting states. Next, we tried to prove the equivalence of the circuits C' and C", using both conventional product traversal as well as our algorithm, as shown in rest of Table 3. The number of latches in C" is shown in Column 5, the CPU time for product traversal in Column 6, and the CPU time for C-1-D Equivalence Check in Column 7. We used the same framework (including the same BDD package), as well as dynamic variable reordering for both methods. Consider the example s953. After the circuit is retimed, the number of latches increased from 29 to 41. Our algorithm succeeds in proving equivalence in less than 4 minutes while product traversal does not finish even after 3 hours. In all our experiments, we did not find any examples where product traversal completed while we did not.

It is also interesting to examine those cases when we were not able to complete even the first phase of converting C to C' (marked with "–" in Column 4). In many such cases, the bottleneck was the failure to perform reachability analysis on C itself. We therefore chose to expose all latches as pseudo-primary outputs (marked with an * in Column 3). It was not surprising that we were still not able to complete verification, since reachability analysis was a problem to start with. Again, note that product traversal also failed to complete on all these examples.

TABLE 4

Results for Conservative C-1-D Check

| Name | C #L | C' #E | C -> C' T (s) | C" #L | Product T (s) | C1D T (s) |
|---|---|---|---|---|---|---|
| sbc | 28 | 15 | 5.1 | 52 | — | 156.6 |
| s1423 | 74 | 71 | 126.1 | 75 | — | 1160.9 |
| phase_dec | 55 | 45 | 10.7 | 56 | — | 94.5 |
| gcd | 59 | 35 | 31.7 | 60 | — | 387.8 |
| ecc | 115 | 102 | 198.4 | 116 | — | 1459.4 |

6.3 Conservative C-1-D Equivalence Check

As described in detail in Section 2, our methodology provides a conservative equivalence check if reachability analyses on the individual machines are eliminated. This is demonstrated in Table 4 for bigger examples in our benchmark suite. Each experiment proceeded as follows: First we obtained the circuit C' from C as before, but without performing reachability analysis on C. This guarantees complete 1-distinguishability for all states of C' and not just the reachable states. C' was then modified to C" by retiming the latches. We then checked that C' and C" are equivalent for all pairs of initial states such that the initial state of C' corresponds to the initial state C" by examining the output. Note that this equivalence check is non-trivial since there is potentially a one-to-many mapping of states from C' to C". If our check is positive, the circuits are guaranteed to be equivalent. If the check is negative, it might be the case that their difference is only in the unreachable part of the state space.

Consider the circuit s1423 in Table 2. No known method has proven capable of traversing the state space of this circuit. Obviously this implies that the even more difficult task of traversing the product state space is beyond practical limits. We demonstrate that our method allows us to modify the circuit in a non-trivial way (change the state space) and still check for equivalence. Our equivalence check completes in about 20 minutes, while product traversal is not practically feasible. The same observations hold for the other circuits shown in Table 4. As a matter of practical interest, we repeated our conservative equivalence check for all circuits shown in Table 3 as well, and found that we obtained false negatives in only two examples.

As part of our continuing effort in this direction, we plan to strengthen our methodology by incorporating existing approximate traversal techniques. Though it will still give only a conservative equivalence check, it might help to reduce the number of false negatives in practice. Also, as mentioned earlier, the methodology can directly utilize any techniques effective in improving the performance of FSM traversal in general.

While several embodiments and variations of the present invention for a method for using Complete-1-Distinguishability for FSM equivalence checking are described in detail herein, it should be apparent that the disclosure and teachings of the present invention will suggest many alternative designs to those skilled in the art.

What is claimed is:

1. A method for determining the equivalence of a specification finite state machine M1, having a Complete-1-Distinguishability property wherein all state pairs are 1-distinguishable such that each state of the specification finite state machine M1 can be distinguished from all other states by an input sequence of length 1, to an implementation finite state machine M2, the method including:

performing a traversal on the specification finite state machine M1 to obtain a set of all reachable states;

determining if the specification finite state machine M1 has the Complete-1-Distinguishability property on all reachable states;

performing sequential synthesis to obtain the implementation finite state machine M2;

performing a traversal on the implementation finite state machine M2 to obtain a set of all reachable states;

performing a 1-equivalence mapping between reachable states of the specification finite state machine M1 and the implementation finite state machine M2; and determining if the 1-equivalence mapping is a bisimulation relation, thereby indicating that the specification finite state machine M1 and implementation finite state machine M2 are equivalent.

2. The method as claimed in claim 1, wherein the step of 1-equivalence mapping defines a relation $\chi$ between the reachable states of the specification finite state machine M1 and implementation finite state machine M2, as follows, $$\chi \subseteq P \times Q = \{(p, q) \mid p \text{ is reachable in } M1,$$

$$q \text{ is reachable in } M2,$$

$$p \text{ and } q \text{ are 1-equivalent}\}$$

wherein $\subseteq$ means is a subset of,

P,Q are the sets of states of the specification finite state machine M1 and the implementation finite state machine M2, p,q are states of the specification finite state machine M1 and the implementation finite state machine M2, x means a cross product of, { } means a set,

| means such that, and $\chi$ means the 1-equivalance mapping between the reachable states of the specification finite state machine M1 and the implementation finite state machine M2;

wherein $\chi$ captures those pairs of reachable states between the specification finite state machine M1 and the implementation finite state machine M2 that are 1-equivalent.

3. The method as claimed in claim 2, the step of 1-equivalence mapping further includes ensuring relation $\chi$ is a one-to-many mapping.

4. The method as claimed in claim 1, wherein the step of performing a transversal on the specification finite state machine M1 further includes assuming that all states in the specification finite state machine M1 are reachable if the transversal does not complete.

5. The method as claimed in claim 1, wherein a subset of latches on the specification finite state machine M1 are exposed as pseudo-primary outputs to enforce the Complete-1-Distinguishability property if specification finite state machine M1 fails the Complete-1-Distinguishability property determination.

6. The method as claimed in claim 5, wherein the step of exposing a subset of latches on the specification finite state machine M1 as pseudo-primary outputs further includes:

obtaining a set of all distinct state pairs which need to be distinguished;

identifying the latches that exhibit a different value in at least one of the distinct state pairs, and selecting a subset of latches which cover all distinct state pairs.

7. The method as claimed in claim 6, wherein the step of exposing a subset of latches on the specification finite state machine M1 as pseudo-primary outputs further includes the removal of any logic/wiring associated with the pseudo-primary outputs in the implementation finite state machine M2.

8. The method as claimed in claim 1, wherein the step of performing a transversal on the implementation finite state machine M2 further includes assuming that all states in the implementation finite state machine M2 are reachable if the transversal does not complete.

9. The method as claimed in claim 1, wherein the determination of whether the 1-equivalence mapping is a bisimulation relation further includes:

Check that for all $(p, q) \in \chi$:

(1): $\forall_{i \in I} (p, i, s) \in \Delta_1 \Rightarrow \exists_{t \in Q} ((q, i, t) \in \Delta_2 \wedge (s, t) \in \chi)$ (2): $\forall_{i \in I} (q, i, t) \in \Delta_2 \Rightarrow \exists_{s \in Q} ((p, i, s) \in \Delta_1 \wedge (s, t) \in \chi)$ wherein $\forall$ means for all, i is an input, $\in$ means is an element of, I is a set of inputs, p and s are states of the specification finite state machine M1 having a transition i therebetween, q and t are states of the implementation finite state machine M2 having a transition i therebetween, $\Delta_1$ and $\Delta_2$ are the transition relations of the specification finite state machine M1 and the implementation finite state machine M2, respectively, $\Rightarrow$ means then, $\exists$ means there exists, P and Q are sets of states of the specification finite state machine M1 and the implementation finite state machine M2, respectively, $\wedge$ means and, $\chi$ means the 1-equivalence mapping between the reachable states of the specification finite state machine M1 and the implementation finite state machine M2; and wherein equation (1) states that for all inputs i, which are an element of I, such that there is an i transition from state p to state s, which belongs to transition relation $\Delta_1$, then there exists a state t, which belongs to the set of states Q, such that there is an i transition from state q to state t, which belongs to transition relation $\Delta_2$, and wherein states s and t belong to $\chi$;

wherein equation (2) states that for all inputs i, which are an element of I, such that there is an i transition from state q to state t, which belongs to transition relation $\Delta_2$, then there exists a state s, which belongs to the set of states P, such that there is an i transition from state p to state s, which belongs to transition relation $\Delta_1$, and wherein states s and t belong to $\chi$; and calculating equation (1) and equation (2) for every state pair where the states are 1-equivalent and are individually reachable.

10. The method as claimed in claim 9, wherein the step of determining whether the 1-equivalence mapping is a bisimulation relation further includes:

determining if equation (1) equals equation (2) for all inputs i; and declaring specification finite state machine M1 equivalent to implementation finite state machine M2 if equation (1) equals equation (2) for all inputs i.

* * * * *